United States Patent [19]

Ide

[11] Patent Number: 4,710,804
[45] Date of Patent: Dec. 1, 1987

[54] COLOR FILTER ARRAYS FOR USE IN A SINGLE CHIP COLOR TELEVISION PICKUP SYSTEM USING THE FIELD INTEGRATION MODE

[75] Inventor: Yuji Ide, Yokohama, Japan

[73] Assignee: Kabushiki Kaisha Toshiba, Kawasaki, Japan

[21] Appl. No.: 12,490

[22] Filed: Feb. 9, 1987

[30] Foreign Application Priority Data

Feb. 18, 1986 [JP] Japan ................................. 61-33353

[51] Int. Cl.$^4$ .......................... H04N 9/07; H04N 9/077
[52] U.S. Cl. .......................................... 358/48; 358/44
[58] Field of Search ...................... 358/48, 44, 43, 41

[56] References Cited

U.S. PATENT DOCUMENTS

| | | | |
|---|---|---|---|
| 4,246,601 | 1/1981 | Sato et al. | 358/44 X |
| 4,460,919 | 7/1984 | Takemura | 358/44 |
| 4,652,911 | 3/1987 | Teranishi et al. | 358/44 |
| 4,670,777 | 6/1987 | Ishikawa et al. | 358/44 X |

FOREIGN PATENT DOCUMENTS 60-125090 7/1985 Japan.

OTHER PUBLICATIONS

The Journal of the Institute of Television Engineers of Japan, vol. 37, No. 10, pp. 855–862, "A Single Chip CCD Color Camera System Using Field Integration Mode"; Yoshiaki Sone et al, Oct. 1983.

Primary Examiner—Michael A. Masinick
Assistant Examiner—E. Anne Faris
Attorney, Agent, or Firm—Oblon, Fisher, Spivak, McClelland & Maier

[57] ABSTRACT

A color television pickup system has a single chip imaging device operating in a field integration mode. In this system, a mosaic color filter array disposed on the imaging device is comprised of unit filter arrays arranged in columns and rows. Each unit filter array consists of eight color filter elements arranged in two columns and four rows. The upper and lower four filter-element arrays in the respective unit filter array are each comprised of color filter elements of green (G), green (G), red (R) and cyan (Cy).

8 Claims, 4 Drawing Figures

COLOR FILTER ARRAYS FOR USE IN A SINGLE CHIP COLOR TELEVISION PICKUP SYSTEM USING THE FIELD INTEGRATION MODE

BACKGROUND OF THE INVENTION

This invention relates to a single-chip solid-state color imaging device using a mosaic color filter array.

A color television pickup system operating in the field integration mode, and using a CCD (charge coupled device) or a MOS (metal oxide semiconductor) imaging device has been developed and practically realized. The solid-state imaging device includes a great number of photoelements (pixels) arranged in the horizontal and vertical directions. The field-integration-mode television pickup system is arranged to simultaneously read out signals of pixels on two adjacent horizontal lines for each field interval. This system has an advantage of producing no residual image of one field since signal charges of all the pixels are read out for every field interval.

In order to obtain a color image, a longitudinal striped color filter array or mosaic color filter array is disposed on the solid-state imaging device. In the imaging device for a color television system which requires high resolution, it is preferable to use the mosaic color filter array which is excellent in horizontal resolution. A great number of color filter elements are arranged in a certain pattern, with each element corresponding to a pixel.

A mosaic color filter array used in a field integration mode has unit filter arrays, each comprised of $2 \times 4$ filter elements. The respective unit filter array is comprised of an upper $2 \times 2$ filter array and a lower $2 \times 2$ filter array having the same combination of color filter elements. Four pairs of two adjacent color filter elements arranged in the vertical direction are different from each other in combination of colors. In the unit filter array, the spectral response characteristics of the color filter elements are so set that color electric signals obtained on the two adjacent horizontal lines become zero when an object of achromatic color is imaged.

A mosaic color filter array is known which is comprised of magenta (Mg), green (G), cyan (Cy) and yellow (Ye) color filter elements. In this connection reference is invited to a paper entitled "A Single Chip CCD Color Camera System Using Field Integration Mode" in "The Journal of the Institute of Television Engineers of Japan", Vol. 37, No. 10, pp. 855 to 862. In order that, in the color filter array having such color filter elements, a color signal Cn on an N line and color signal Cn+1 on an N+1 line may become zero when an object of achromatic color is imaged, the spectral response characteristics of the color filter elements are determined to allow electric signals represented by (Ye+Mg) and (Cy+G) in the upper 4-pixel array to be equal to each other in their signal quantity and electric signals represented by (Cy+Mg) and (Ye+G) in the lower 4-pixel array to be equal to each other in their signal quantity. The filter array has an excellent resolution.

When, however, a special object having no vertical correlation, such as horizontally extending stripes, is imaged by the solid-state imaging device using the mosaic color filter array as described above, there is a possibility that a false color signal will be generated. For an object whose black-to-white boundary extends in the horizontal direction, for example, if such a boundary is focused midway between the upper 4-pixel array and the lower 4-pixel array in the aforementioned unit filter array, then color signals obtained from the upper and lower 4-pixel arrays become zero, resulting in no false color signal. Where the black-to-white boundary is imaged at the middle of either the upper 4-pixel array or the lower 4-pixel array, color signal components are generated, since the color signals produced by the 4-pixel array with such a boundary imaged there never become zero. These color signals are false in nature since they should not be generated from the black-and-white object. It is to be noted that many complementary color filter elements are employed in the color filter array.

A mosaic color filter array formed of color filters of primary colors, that is, green (G), red (R) and blue (B) is known in this field of art, for which reference is invited to Japanese Laid-Open Patent Publication No. 60-125090. In the unit filter array employing the primary colors, the upper and lower 4-pixel arrays are formed of G, G, R and B filter elements. In this filter element array, even if a black-to-white boundary is focused at the middle of the 4-pixel array, a false signal, unlike the aforementioned filter array, is never produced. Furthermore, the aforementioned complementary-color filter array is superior to the primary-color filter array in resolution.

However, the latter filter array has a drawback as will be set forth below. A brightness signal Y is given by a baseband component of a horizontal scanning signal. That baseband component is given below, paying attention only to the number of filter elements used.

$$Y = \tfrac{1}{4}\{(\tfrac{1}{2})R + G + (\tfrac{1}{2})B)\}$$

From the relative spectral response characteristics of the R, G and B filter elements and the imaging device, a ratio of light energies passing through the filter elements and obtained from the imaging device is $$R:G:B = 1:0.9:0.5$$

Taking the spectral response characteristics into consideration, Y' is given below so that the brightness signal becomes unity when $R = G = B = 1$ in electrical signals.

$$Y' = (1/0.825)\{0.25R + (0.9 \times 0.5)G + (0.5 \times 0.25)B\}$$
$$= 0.303R + 0.545G + 0.152B$$

The brightness signal Ys of the standard color television system is $$Y_s = 0.30R + 0.59G + 0.11B$$

That is, for the brightness signal obtained from the color filter array using the primary colors' filter elements, the green light component to which human eyes are most sensitive is smaller in magnitude than in the standard brightness signal and thus a green color would be reproduced somewhat darkly.

SUMMARY OF THE INVENTION

An object of this invention is to provide an improved color television pickup system having a single chip imaging device adapted for operating in a field integration mode.

Another object of this invention is to provide a color television pickup system having a single chip imaging device operating in the field integration mode, which can prevent the generation of a false color signal and has excellent resolution.

Another object of this invention is to provide a color television pickup system having a single chip imaging device operating in the field integration mode, which can brightly reproduce a green color without impairing the function of preventing the generation of a false color signal and has excellent resolution.

In order to attain the objects of this invention, a mosaic color filter array disposed on a single chip imaging device is comprised of 2×4 pixel unit filter arrays in which upper and lower 4-pixel filter arrays are each formed of color filter elements of green (G), green (G), red (R) and cyan (Cy), which are arranged such that each pair of two horizontally adjacent filter elements have no identical color filters and pairs of two vertically adjacent color filter elements are different from each other in combination of colors.

BRIEF DESCRIPTION OF THE DRAWINGS

FIG. 3 shows the relative spectral sensitivity characteristics of color filter elements used in the color filter array of FIG. 1; and FIG. 4 shows a mosaic color filter array according to another embodiment of this invention.

DETAILED DESCRIPTION OF THE PREFERRED EMBODIMENTS

Figure 2:
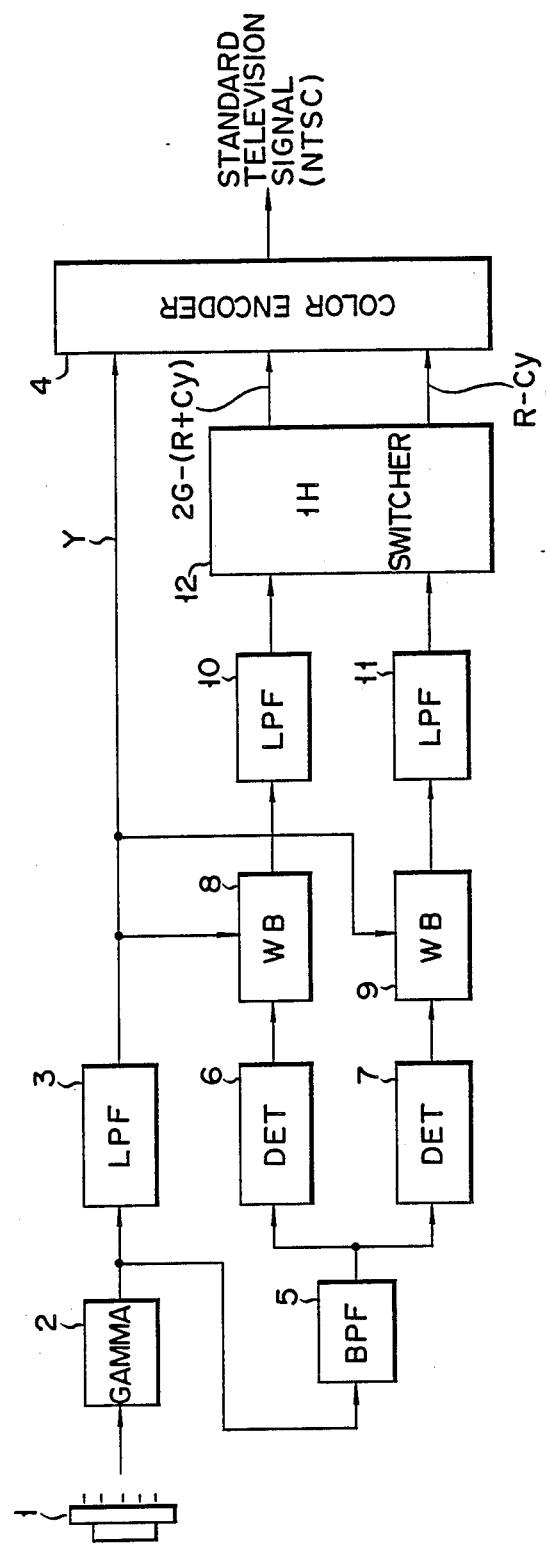
FIG. 2 is a block diagram of an electric circuit arrangement of a single chip color television pickup system using the color filter array of this invention.

In a color television pickup system of this invention as shown in FIG. 2, solid-state image pickup device 1 is comprised of, for example, a CCD chip and driven in a field integration mode. A mosaic color filter array is disposed on the light-receiving surface of the CCD chip.

In the mosaic color filter array, a great number of color filter elements are arranged in columns and rows with each corresponding to one pixel of the CCD, noting that the color filter elements of 2 columns ×4 rows are arranged as a unit filter array in the horizontal and vertical directions. In the unit filter array, green (G) and cyan (Cy) color filter elements are arranged in the first row; green (G) and red (R) color filter elements, in the second row; green (G) and cyan (Cy) color filter elements, in the third row; and red (R) and green (G) color filter elements, in the fourth row. In this unit filter array, the upper 2×2 pixel filter array and lower 2×2 pixel filter array have the same combination of colors as in the case of known color filter arrays. The four pairs of two vertically adjacent color filter elements are different from each other in combination of colors. Each pair of two horizontally adjacent filter elements have different colors.

An output signal of image pickup device 1 is applied through gamma correction circuit 2 to low-pass filter 3 and bandpass filter 5. Low-pass filter 3 has a frequency characteristic for extracting a brightness signal component or a baseband signal component Y from the output signal of image pickup device 1 and bandpass filter 5 has a frequency characteristic for extracting color signal components or modulated signal components. The frequency characteristic of bandpass filter 5 depends on the pitch of the pixels of imaging device 1.

An output signal of low-pass filter 3 is applied to color encoder 4 and an output signal of bandpass filter 5, that is, color signal components, is applied to synchronous detectors 6 and 7 where color signal components are demodulated. The output signals of detectors 6 and 7 are fed to white balance circuits 8 and 9, respectively. Part of the brightness signal component Y from low-pass filter 3 is injected into white balance circuits 8 and 9 whereby the color signal components become zero when an achromatic object is imaged. The output signals of white balance circuits 8 and 9 are applied respectively through low-pass filters 10 and 11 to 1H switcher 12 which, in turn, applies simultaneous color signals to color encoder 4. Color encoder 4 is responsive to the brightness signal component and two color signal components to prepare a standard color television signal such as the NTSC television signal.

In the imaging device thus arranged, an optical image incident through an object lens, not shown, is imaged through the aforementioned mosaic filter array onto photoelements in the CCD chip. Imaging device 1 is driven by a drive pulse generator, not shown, to output an electric signal of the respective pixel by a charge-coupled transfer.

Figure 1:
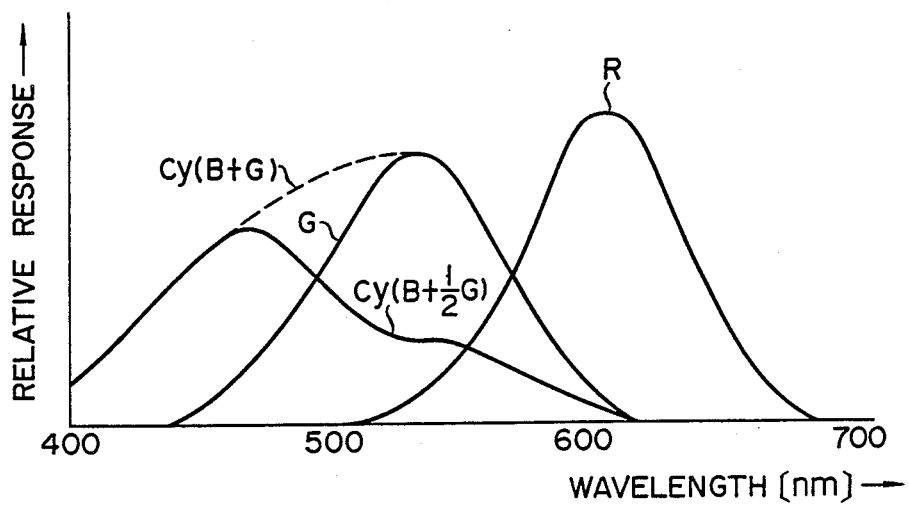
FIG. 1 shows a mosaic color filter array according to one embodiment of this invention.

A horizontal video signal $S_n$ obtained by scanning an N line in FIG. 1 is given by $$S_n = 1/2(2G + R + Cy) + 4/\pi\, G \sin \omega t - \quad (1)$$
$$2/\pi(R + Cy) \sin \omega t$$
$$= 1/2(2G + R + Cy) + 2/\pi\{2G - (R + Cy)\}\sin \omega t$$

where $\omega$ denotes a spatial circular frequency depending upon the pitch of the pixels of the imaging device.

The output signal $S_n$ of the CCD contains a brightness component which is a baseband signal and a modulated color signal component on the first and second terms of Equation (1), respectively.

An output signal $S_{n-1}$ on the N−1 line is given by $$S_n - 1 = (1/2)(2G + R + Cy) + (2/\pi)\{(G + R) - \quad (2)$$
$$(G + Cy)\}\sin \omega t$$
$$= (1/2)(2G + R + Cy) + (2/\pi)(R - Cy)\sin \omega t$$

The brightness signal component $$Y = (\tfrac{1}{4})(2G + R + Cy)$$

is extracted by low-pass filter 3 for application to color encoder 4. The color signal component $$(2/\pi)\{2G - (R + Cy)\}$$

of the video signal on the N line is detected by synchronous detector 6, while on the other hand the color signal component $$(2/\pi)(R - Cy)$$

on the N−1 line is detected by synchronous detector 7.

The detected color signal components are applied to white balance circuits 8 and 9. White balance circuits 8 and 9 inject part of the brightness signal component into output signals of detectors 6 and 7 so that the average level of the color signal components becomes zero when an achromatic color object is imaged. More specifically, white balance circuit 8 injects the brightness signal component Y so that the average level of color signal components 2G and R+Cy for the achromatic color object becomes zero. On the other hand, white balance circuit 9 injects the brightness signal component so that the average level of the color signal components R and Cy becomes zero. An amount of injection of the brightness signal is initially set so that the average level of the color signal components becomes zero at a white balancing time.

The output signals of white balance circuits 8 and 9 are fed respectively through low-pass filters 10 and 11 to 1 H switcher 12. Thus the color signal component 2G−(R+Cy) on the N line and color signal component R−Cy on the N−1 line are simultaneously applied to color encoder 4.

Low-pass filters 10 and 11 have a frequency passband ranged from a DC level to 1 MHz and produce color difference signals Cn and Cn−1 of a low frequency range. The Cn and Cn−1 are given by $$Cn = 2G - (R+Cy) \qquad (3)$$

$$Cn-1 = R - Cy \qquad (4)$$

FIG. 3 shows spectral response characteristics of filter elements R, G and Cy in the color filter array shown in FIG. 1. The spectral response characteristics of the filter elements R and G may be the same as those of the conventional filter array. In the case of the filter element Cy, however, the spectral response characteristic is set to have a lower sensitivity to a green light component as indicated by a solid line in FIG. 3 upon comparison with the ordinary characteristic (B+G) of the Cy filter as indicated by a dotted line in FIG. 3. In other words, the sensitivity of a green light component is reduced relative to the sensitivity of a blue light component. With the Cy filter characteristic represented by B+αG, the spectral response characteristic of the Cy filter as shown in FIG. 3 corresponds to B+(½)G. This is done in order that the amounts of light energies passing through the R, G and Cy filters and obtained from the imaging device, that is, the areas surrounded by the response curves of the R, G and Cy filter elements as shown in FIG. 3, may become substantially equal to one another. An electrical signal of a pixel in a CCD is proportional to the spectral response of the corresponding filter element. In the characteristics shown in FIG. 3, $$R:G:Cy = 1:0.9:1 \qquad (5)$$

Consideration will now be given below regarding a color signal component which is obtained from an object having an upper, black-colored portion and a lower, white-colored portion with a horizontal boundary therebetween.

Where the black-to-white boundary is imaged between the N and N−1 lines, color signals Cn and Cn−1 as obtained from the N and N−1 lines are given by $$Cn-1 = R - Cy = 0$$

$$Cn = 2G - (R+Cy)$$

As evident from Equation (5), $R \approx G \approx Cy$ and hence $Cn \approx 0$. Therefore, no false color signal is generated. Where the black-to-white boundary exists between the N' and N'−1 lines, $$Cn-1 = R - Cy = 0$$

$$Cn = 2G - (R+Cy) = G - R$$

Since $R \approx G$ from Equation (5), $Cn \approx 0$. In this case any false signal is not generated.

Next, consideration will be given below regarding a proportion of the G component in the brightness signal Y. The brightness signal Y is given below by the baseband signal in Equation (1).

$$Y = K \cdot (\tfrac{1}{4})(2G + R + Cy) \qquad (6)$$

where K is a constant.

The brightness signal Y', taking into consideration Cy=B+(½)G, the spectral response characteristics R:B=1:0.5 as explained in connection with the prior art, and the spectral response characteristics of Equation (5) can be given by $$\begin{aligned}Y' &= K \cdot (1/2)\{(2 \times 0.9G) + R + (0.9G/2 + 0.5B)\} \\ &= K \cdot (0.5R + 1.125G + 0.25B)\end{aligned} \qquad (7)$$

If, when R=G=B=1 in electrical signals, the constant K is obtained to yield Y'=1, then Equation (7) becomes $$\begin{aligned}Y' &= (1/1.875)(0.5R + 1.125G + 0.25B) \approx \\ &\quad 0.27R + 0.60G + 0.13B\end{aligned} \qquad (8)$$

The brightness signal as given by Equation (8) becomes almost equal to the brightness signal of the aforementioned standard television system. This means that a green color can be brightly reproduced.

In the color filter array shown in FIG. 1 excellent resolution and sensitivity are obtained because the number of the filter elements G, Cy for allowing the green light component to pass therethrough is greater than that of the prior art color filter array using primary color filter elements.

This invention is not restricted to the aforementioned embodiment. For example, the ratio of the sensitivity between components G and B in the Cy filter element may be set properly, taking into consideration the prevention of the false color signal generation as well as the reproducibility of a green color. Furthermore, the R and Cy filter elements may be replaced by the Cy and R, respectively, as indicated in FIG. 4. In the filter array of FIG. 4, a false color signal may be produced, depending upon the spectral response characteristics of the filter elements. However, this possibility is less than in the conventional filter array employing complementary-color filter elements.

What is claimed is:
1. A color television pickup system comprising:
   a solid state imaging device adapted for operation in a field integration mode; and
   a mosaic color filter array disposed on said solid state imaging device, and having unit filter arrays arranged in columns and rows, each of said unit filter arrays having eight color filter elements arranged in two columns and four rows, an upper filter array of four filter elements and a lower filter array of four filter elements in each of said unit filter arrays each consisting of color filter elements of green (G), green (G), red (R) and cyan (Cy), four pairs of two adjacent color filter elements, in each of unit filter arrays, arranged in columns being different from each other in combination of colors, and each pair of two adjacent color filter elements arranged in a row having different colors.

2. A color television pickup system according to claim 1, wherein said unit filter array is composed of four rows of color filter elements of G, Cy; G, R; G, Cy; and R, G.

3. A color television pickup system according to claim 1, wherein said unit filter array is composed of four rows of color filter elements of G, R; G, Cy; G, R; and Cy, G.

4. A color television pickup system according to claim 1, wherein each of said filter elements of cyan (Cy) has a spectral response characteristic in which the sensitivity of a green light component is reduced compared to the sensitivity of a blue light component.

5. A color filter array for use in a single chip color television pickup system using a field integration mode comprising: unit filter arrays arranged in columns and rows, each of said unit filter arrays having eight color filter elements arranged in two columns and four rows, an upper filter array of four filter elements and a lower filter array of four filter elements in each of said unit filter arrays each consisting of color filter elements of green (G), green (G), red (R) and cyan (Cy), four pairs of two adjacent color filter elements, in each of said unit filter arrays, arranged in columns being different from each other in combination of colors, and each pair of two adjacent color filter elements arranged in a row having different colors.

6. A color filter array according to claim 5, wherein said unit filter array is composed of four rows of color filter elements of G, Cy; G, R; G, Cy; and R, G.

7. A color filter array according to claim 5, wherein said unit filter array is composed of four rows of color filter elements of G, R; G, Cy; G, R; and Cy, G.

8. A color filter array according to claim 5, wherein each of said filter elements of cyan (Cy) has a spectral response characteristic in which the sensitivity of a green light component is reduced compared to the sensitivity of a blue light component.

* * * * *